United States Patent
Chen et al.

(10) Patent No.: US 10,622,510 B2
(45) Date of Patent: Apr. 14, 2020

(54) VERTICAL TYPE LIGHT EMITTING DIODE DIE AND METHOD FOR FABRICATING THE SAME

(71) Applicant: INGENTEC CORPORATION, Miaoli County (TW)

(72) Inventors: Ya-Li Chen, Miaoli County (TW); Chi-Ming Wang, Miaoli County (TW); Chia-Wei Tu, Miaoli County (TW); Cheng-Yu Chung, Miaoli County (TW); Hsiang-An Feng, Miaoli County (TW)

(73) Assignee: Ingentec Corporation, Miaoli County (TW)

( * ) Notice: Subject to any disclaimer, the term of this patent is extended or adjusted under 35 U.S.C. 154(b) by 0 days.

(21) Appl. No.: 16/011,936

(22) Filed: Jun. 19, 2018

(65) Prior Publication Data

US 2019/0189837 A1    Jun. 20, 2019

Related U.S. Application Data

(62) Division of application No. 15/844,785, filed on Dec. 18, 2017.

(51) Int. Cl.
*H01L 33/00* (2010.01)
*H01L 33/62* (2010.01)
(Continued)

(52) U.S. Cl.
CPC ...... *H01L 33/0079* (2013.01); *H01L 25/0753* (2013.01); *H01L 33/0095* (2013.01);
(Continued)

(58) Field of Classification Search
CPC ... H01L 33/0079; H01L 33/08; H01L 33/387; H01L 33/62; H01L 25/0753; H01L 2224/10; H01L 2924/00014
(Continued)

(56) References Cited

U.S. PATENT DOCUMENTS

2012/0153304 A1* 6/2012 Schubert ............... H01L 33/382
                                                              257/79
2013/0112999 A1* 5/2013 Seo ........................ H01L 33/06
                                                              257/87
(Continued)

FOREIGN PATENT DOCUMENTS

CN           106834764 A   *  6/2017

OTHER PUBLICATIONS

CN 106834764, 2017 (Year: 2017).*

*Primary Examiner* — Patricia D Reddington
(74) *Attorney, Agent, or Firm* — Rosenberg, Klein & Lee

(57) ABSTRACT

A vertical type light emitting diode die and a method for fabricating the same is disclosed. A growth substrate is provided and an epitaxial layer is formed on the growth substrate. A metallic combined substrate is connected to the epitaxial layer. Then, the growth substrate is removed. Electrode units are formed on the top surface of the epitaxial layer. The epitaxial layer is divided into epitaxial dies according to the number of the plurality of electrode units. Each vertical type light emitting diode die formed in the abovementioned way includes the metallic combined substrate having a first metal layer and second metal layers. The first metal layer is combined with the two second metal layers by cutting, vacuum heating, and polishing, so as to enable the metallic combined substrate to have a high coefficient of thermal conductivity, a low coefficient of thermal expansion, and initial magnetic permeability.

6 Claims, 9 Drawing Sheets

(51) Int. Cl.
*H01L 33/08* (2010.01)
*H01L 25/075* (2006.01)
*H01L 33/38* (2010.01)
*H01L 33/64* (2010.01)
*H01L 33/40* (2010.01)

(52) U.S. Cl.
CPC ............ *H01L 33/08* (2013.01); *H01L 33/387* (2013.01); *H01L 33/405* (2013.01); *H01L 33/62* (2013.01); *H01L 33/641* (2013.01); H01L 2224/10 (2013.01); H01L 2924/00014 (2013.01); H01L 2933/0016 (2013.01); H01L 2933/0075 (2013.01)

(58) Field of Classification Search
USPC .......................................................... 257/99
See application file for complete search history.

(56) References Cited

U.S. PATENT DOCUMENTS

| | | | |
|---|---|---|---|
| 2013/0334445 A1* | 12/2013 | Tharumalingam | H01L 24/97 250/552 |
| 2014/0127073 A1* | 5/2014 | Nishiyama | C22C 30/02 420/36 |
| 2014/0242506 A1* | 8/2014 | Shirasuna | G03G 5/043 430/56 |
| 2015/0144974 A1* | 5/2015 | Chen | H01L 27/15 257/93 |
| 2015/0179875 A1* | 6/2015 | Jang | H01L 21/02647 438/46 |
| 2016/0118564 A1* | 4/2016 | Kim | H01L 33/20 257/99 |
| 2017/0125180 A1* | 5/2017 | Han | H01H 1/021 |
| 2017/0271298 A1* | 9/2017 | Heinrich | H01L 24/81 |

* cited by examiner

VERTICAL TYPE LIGHT EMITTING DIODE DIE AND METHOD FOR FABRICATING THE SAME

REFERENCE TO RELATED APPLICATION

This Application is a Divisional Application of Ser. No. 15/844,785, filed 18 Dec. 2017, currently pending.

BACKGROUND OF THE INVENTION

Field of the Invention

The present invention relates to a light emitting diode die and a method for fabricating the same, particularly to a vertical type light emitting diode die having a high coefficient of thermal conductivity, a low coefficient of thermal expansion, and initial magnetic permeability and a method for fabricating the same.

Description of the Related Art

Light-emitting diodes (LEDs) used as light sources are fabricated using the semiconductor technology and formed by III-V group compound semiconductors. The LED operates based on a fact that electrons are combined with holes in a semiconductor to produce photons. The LED is different from the conventional light bulb working at a high temperature of thousands of degrees and a fluorescent lamp using a high voltage to excite an electron beam. Like a general element, a LED requires a voltage of 2~4 V and works at a normal temperature. Thus, the life of a LED is longer than that of the conventional light source.

LEDs are divided into a horizontal structure and a vertical structure. Two electrodes of a horizontal LED are arranged at the same side of a LED chip. Two electrodes of a vertical LED are respectively arranged two sides of an epitaxial layer of the LED. Compared with the horizontal LED, the vertical LED has advantages of high brightness, fast cooling, small luminous decay, and high stability. No matter in structure, photoelectric parameter, thermal property, luminous decay, and cost, the heat dissipating effect of the vertical LED is much better than that of the horizontal LED. Due to the good heat dissipating property of the vertical LED, the heat generated by the chip is dissipated on time, thereby minimizing the attenuation in performance of the chip and phosphor. Thus, a LED features high brightness, fast cooling, small luminous decay, and small drift of light color and provides more reliable stability.

However, LEDs are widely applied to many fields. For example, LEDs are applied to a smart phone. When the smart phone overheats, the LED chip installed therein is also affected. The phenomena affect the substrate of the LED chip where a die is located. The substrate of the LED chip is connected to the smart phone or other devices. If the substrate has a high coefficient of thermal expansion, the substrate is easily deformed due to the variation of temperature, thereby influencing the lighting efficiency of the LED chip.

Accordingly, the present invention provides a vertical type light emitting diode die and a method for fabricating the same to solve the abovementioned problems, whereby a substrate having a low cost, a high coefficient of thermal conductivity, a low coefficient of thermal expansion, and initial magnetic permeability is produced.

SUMMARY OF THE INVENTION

A primary objective of the present invention is to provide a vertical type light emitting diode die and a method for fabricating the same, which provides a metallic combined substrate more suitable for a process of fabricating LEDs. The production yield of wire bonding of the metallic combined substrate is higher than that of a silicon substrate. The fabrication cost of the metallic combined substrate is lower than that of a general metal substrate. The metallic combined substrate has a high coefficient of thermal conductivity and a low coefficient of thermal expansion, which greatly match the process of fabricating LEDs, whereby the installed LED stably maintains high lighting efficiency rather than affects the substrate and deforms due to the variation of temperature.

Another objective of the present invention is to provide a vertical type light emitting diode die and a method for fabricating the same, wherein in addition to a high coefficient of thermal conductivity and a low coefficient of thermal expansion, the metallic combined substrate has initial magnetic permeability, such that a LED die transmits a micro current and generates electricity and light without connecting to a voltage source.

Further objective of the present invention is to provide a vertical type light emitting diode die and a method for fabricating the same, wherein the metallic combined substrate having initial magnetic permeability can overcome the problem with mass transfer of micro LEDs to massively transport or transfer LEDs in a fabrication process.

Yet another objective of the present invention is to provide a vertical type light emitting diode die and a method for fabricating the same, wherein the heat-dissipating efficiency of the vertical type light emitting diode die is higher than that of the horizontal type light emitting diode die. After packaging the vertical type light emitting diode die, a LED module with higher lighting efficiency is provided.

To achieve the abovementioned objectives, the present invention provides a vertical type light emitting diode die, which comprises a metallic combined substrate comprising a first metal layer and two second metal layers respectively formed on a top surface and a bottom surface of the first metal layer, and the first metal layer is combined with the two second metal layers by cutting, vacuum heating, and polishing, so as to enable the metallic combined substrate to have a high coefficient of thermal conductivity, a low coefficient of thermal expansion, and initial magnetic permeability; and an epitaxial electrode layer formed on the metallic combined substrate.

The present invention also provides a method for fabricating a vertical type light emitting diode die, which comprises: providing a growth substrate and forming an epitaxial layer on the growth substrate; providing a metallic combined substrate formed by cutting, vacuum heating, and polishing; forming a connecting metal layer on the metallic combined substrate and connecting the metallic combined substrate to the epitaxial layer through the connecting metal layer; removing the growth substrate; forming a plurality of electrode units on a top surface of the epitaxial layer; and dividing the epitaxial layer into a plurality of epitaxial dies on the metallic combined substrate according to the number of the plurality of electrode units.

In an embodiment of the present invention, the epitaxial electrode layer further comprises a connecting metal layer formed on the metallic combined substrate; and at least one epitaxial die formed on the connecting metal layer, the at least one epitaxial die is provided with an electrode unit thereon.

In an embodiment of the present invention, the first metal layer comprises an alloy of nickel and ferrum, and the second metal layer comprises copper.

In an embodiment of the present invention, the ratio of the second metal layer to the first metal layer to the second metal layer of the metallic combined substrate in thickness is 1:2.5~3.5:1.

In an embodiment of the present invention, the thickness of the metallic combined substrate is less than or equal to 200 μm.

In an embodiment of the present invention, the cutting is laser cutting, and the polishing is chemical mechanical polishing or copper polishing.

In an embodiment of the present invention, the metallic combined substrate uses the initial magnetic permeability to generate a micro current and transmit the micro current to the epitaxial electrode layer.

In an embodiment of the present invention, after the step of dividing the epitaxial layer into the plurality of epitaxial dies, the connecting metal layer and the metallic combined substrate are divided according to the number of the plurality of epitaxial dies, and wire bonding and packaging processes are performed on the plurality of epitaxial dies, the connecting metal layer and the metallic combined substrate to form light-emitting diodes.

In an embodiment of the present invention, the light-emitting diode generates electricity and light without connecting to a voltage source.

In an embodiment of the present invention, the growth substrate is removed using a chemical solution or a laser.

Below, the embodiments are described in detail in cooperation with the drawings to make easily understood the technical contents, characteristics and accomplishments of the present invention.

DETAILED DESCRIPTION OF THE INVENTION

In order to stabilize and enhance the lighting efficiency of LEDs and apply to a vertical type LED, the present invention improves a die and a method for fabricating the same to change a coefficient of thermal expansion of a substrate under the die and increase a coefficient of thermal conductivity of the substrate. Thus, the deformation of the substrate does not influence the lighting efficiency of the LED at higher temperature later on. Owning to the special material of the substrate, the structure of the present invention can generate electricity and light without connecting a voltage source.

Figure 1:
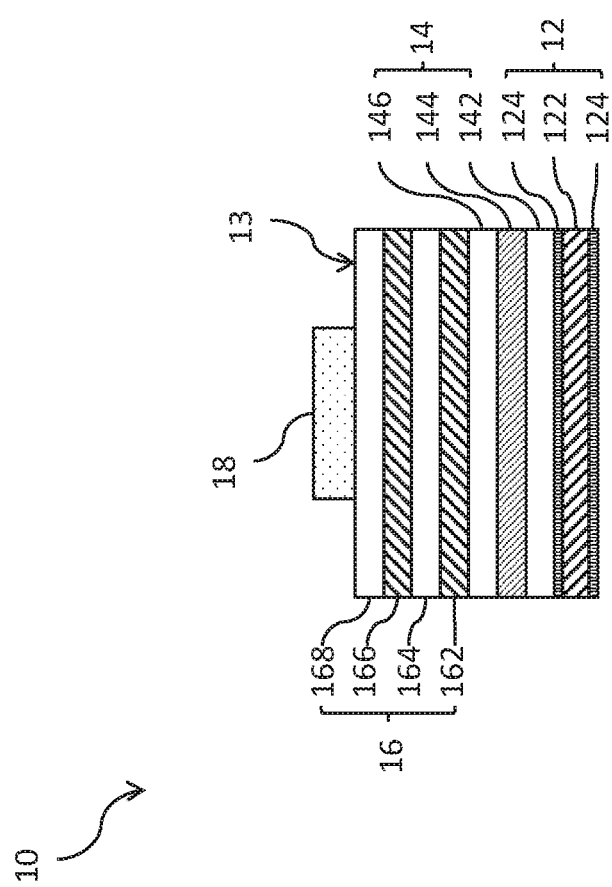
FIG. 1 is a diagram showing a vertical type light emitting diode die according to the first embodiment of the present invention.
Figure 2:
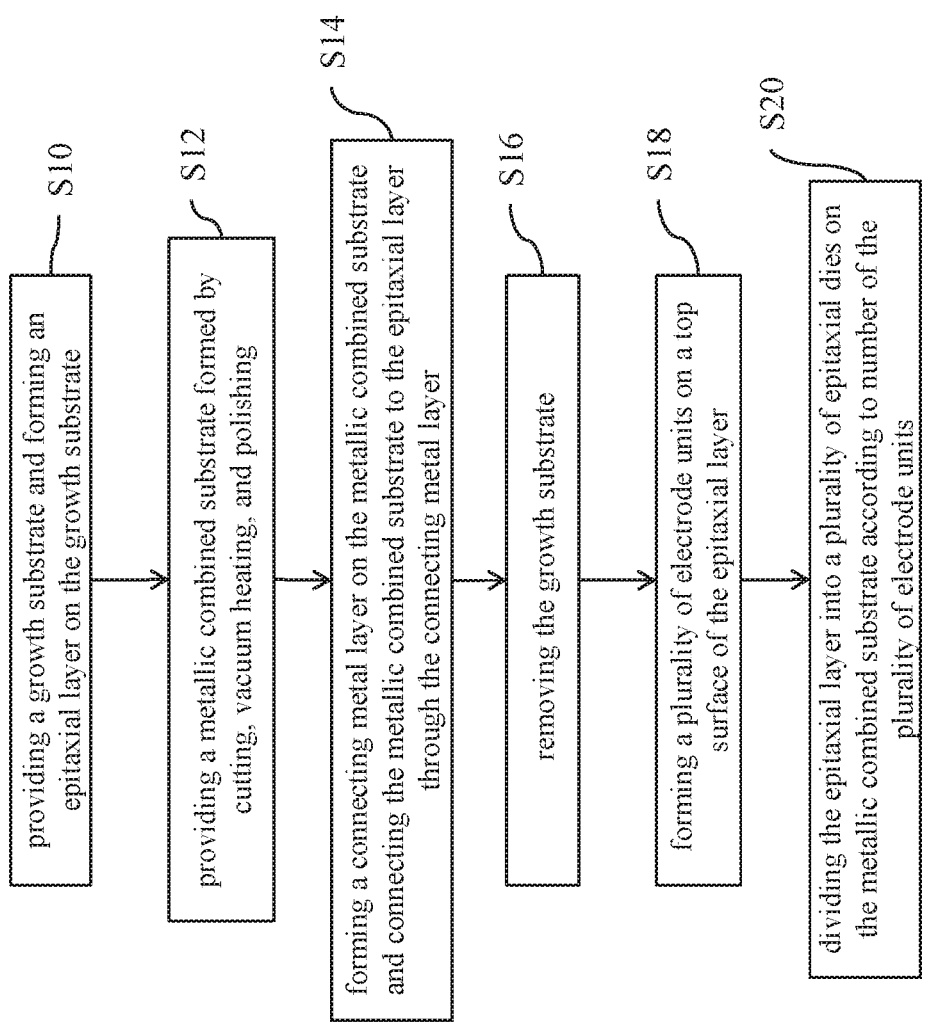
FIG. 2 is a flowchart showing a method for fabricating a vertical type light emitting diode die according to the first embodiment of the present invention.

Refer to FIG. 1. The vertical type light emitting diode die 10 comprises a metallic combined substrate 12 and an epitaxial electrode layer 13. The epitaxial electrode layer 13 includes a connecting metal layer 14, at least one epitaxial die 16 and at least one electrode unit 18. In the embodiment, taking one epitaxial die 16 as example. The connecting metal layer 14 is formed on the metallic combined substrate 12. The epitaxial die 16 is formed on the connecting metal layer 14. The electrode unit 18 is formed on the epitaxial die 16.

Continuing from the abovementioned paragraph, the metallic combined substrate 12 includes a first metal layer 122 and two second metal layers 124. The second metal layers 124 are formed on the top surface and the bottom surface of the first metal layer 122. The first metal layer 122 comprises an alloy of nickel and ferrum, wherein the ratio of nickel to the alloy is 36%. The second metal layer 124 comprises copper. The ratio of the first metal layer 122 to the second metal layer 124 in thickness is 2.5~3.5:1. In other words, the ratio of the second metal layer 124 to the first metal layer 122 to the second metal layer 124 in thickness is 1:2.5~3.5:1. The present invention exemplifies a fact that the ratio of the first metal layer 122 to the second metal layer 124 in thickness is 3:1. For example, the best thickness of the first metal layer 122 is 60 μm and the best thickness of the second metal layer 124 is 20 μm, but the present invention is not limited thereto. The thickness of the metallic combined substrate 12 is less than or equal to 200 μm.

Furthermore, the connecting metal layer 14 includes a contact layer 142, a reflection layer 144 and a current distribution layer 146. The contact layer 142 is formed on the metallic combined substrate 12. The reflection layer 144 is formed on the contact layer 142. The current distribution layer 146 is formed on the reflection layer 144. The reflection layer 144 is provided with the epitaxial die 16 thereon. In the embodiment, the contact layer 14 is a P-type contact, and the reflection layer 144 is used as a reflector, and the current distribution layer 146 is a P-type GaP layer.

As mentioned above, the epitaxial die 16 further comprises a first AlGaInP layer 162, a multi-quantum wells (MQWs) layer 164, a second AlGaInP layer 166, and a GaAs layer 168. The first AlGaInP layer 162 is formed on the current distribution layer 146. The MQWs layer 164 is formed on the first AlGaInP layer 162. The second AlGaInP layer 166 is formed on the MQWs layer 164. The GaAs layer 168 is formed on the second AlGaInP layer 166. The GaAs layer 168 is provided with the electrode unit 18 thereon. In the embodiment, the first AlGaInP layer 162 is a P-type AlGaInP layer, and the second AlGaInP layer 166 is an N-type AlGaInP layer, and the GaAs layer 168 is an N-type GaAs layer.

Figure 3A:
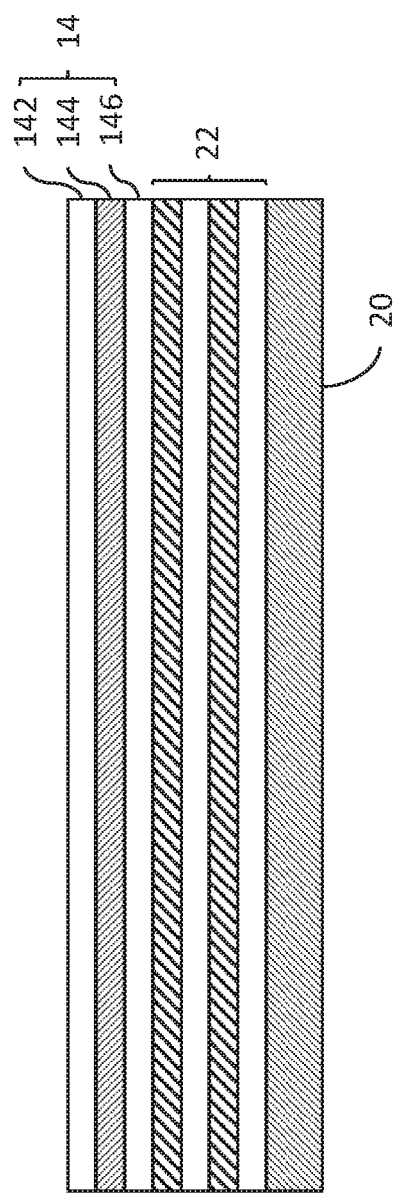
FIGS. 3a-3f are diagrams schematically showing the steps of fabricating a vertical type light emitting diode die according to the first embodiment of the present invention.
Figure 3B:
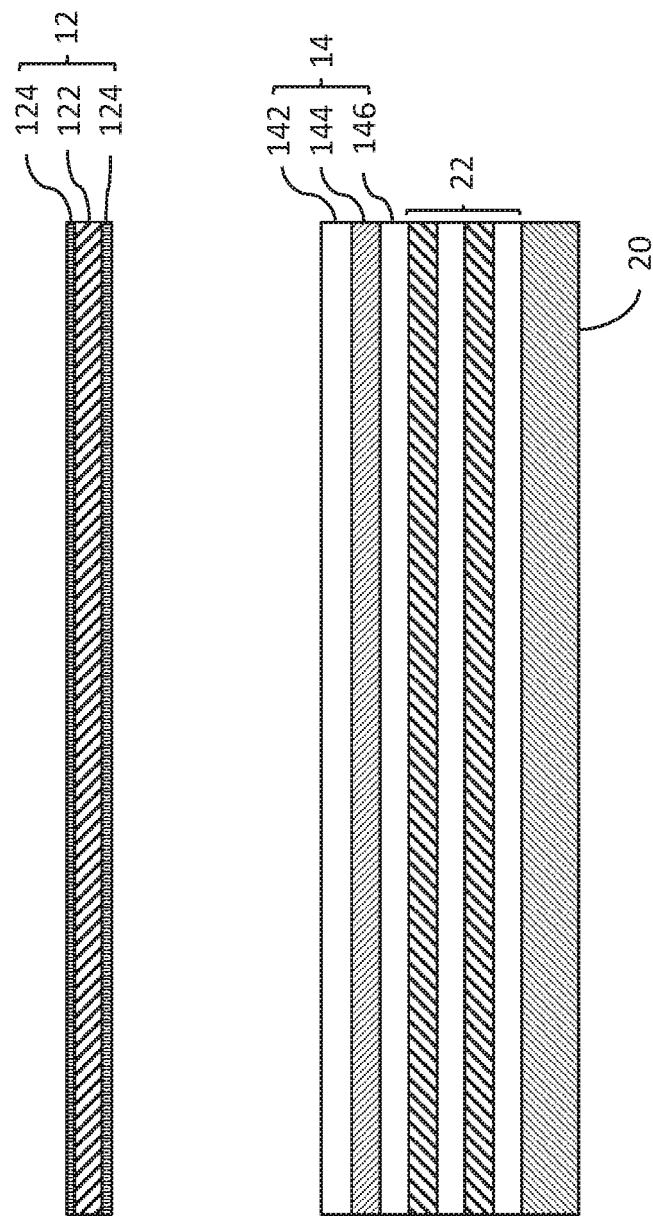
Figure 3C:
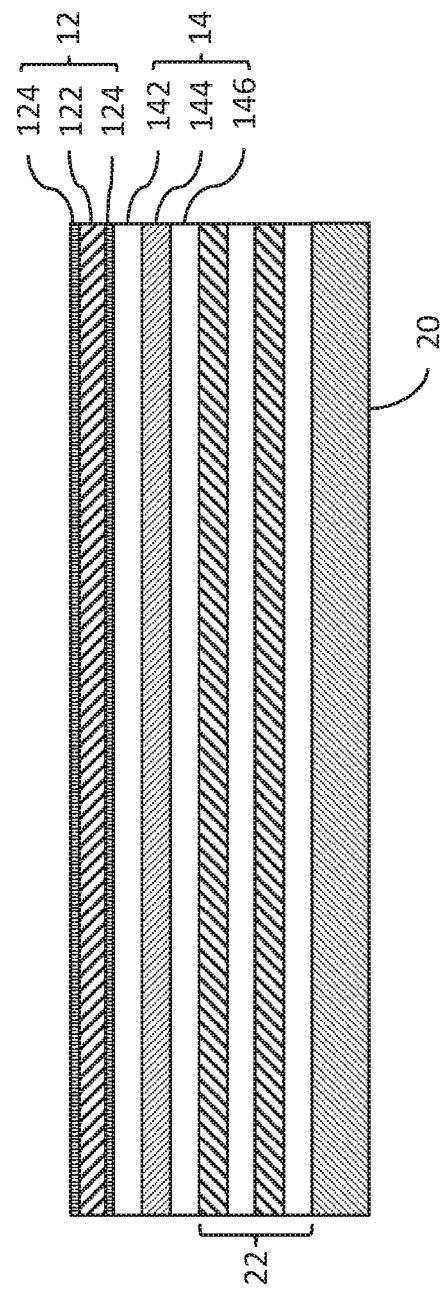
Figure 3D:
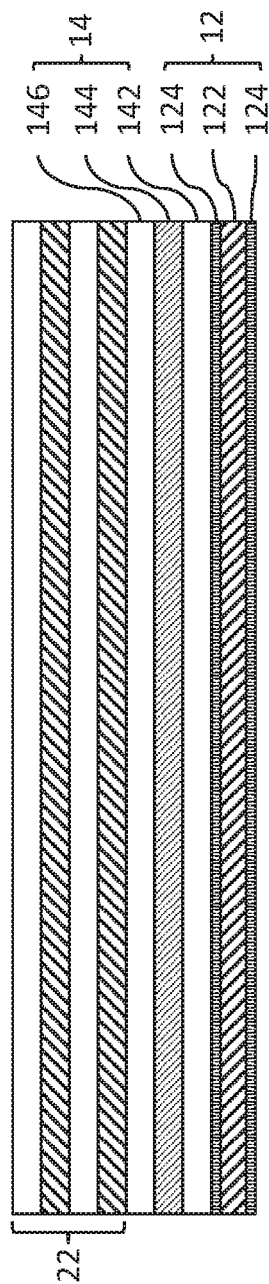
Figure 3E:
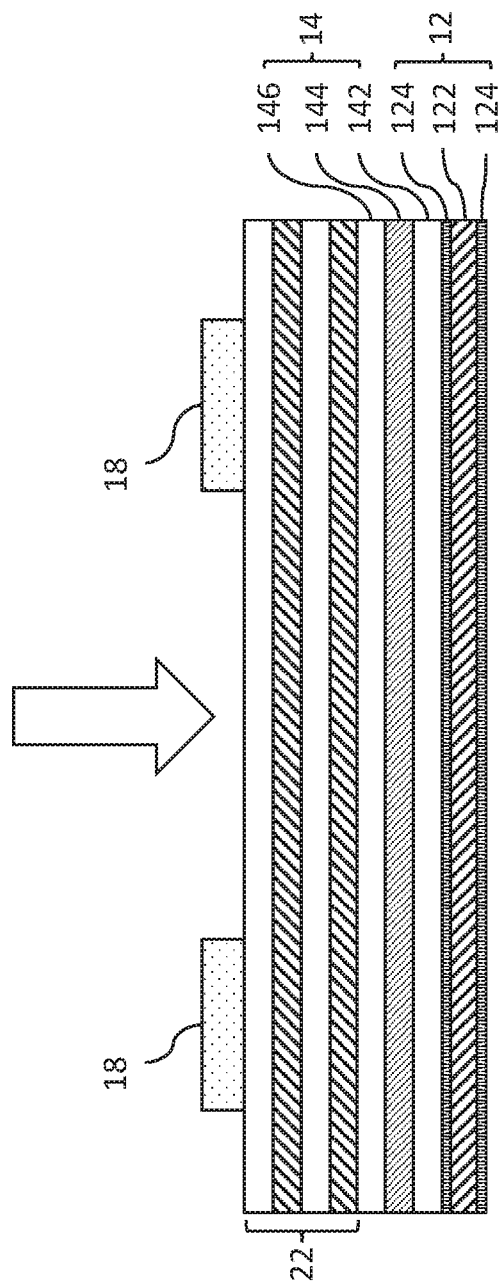
Figure 3F:
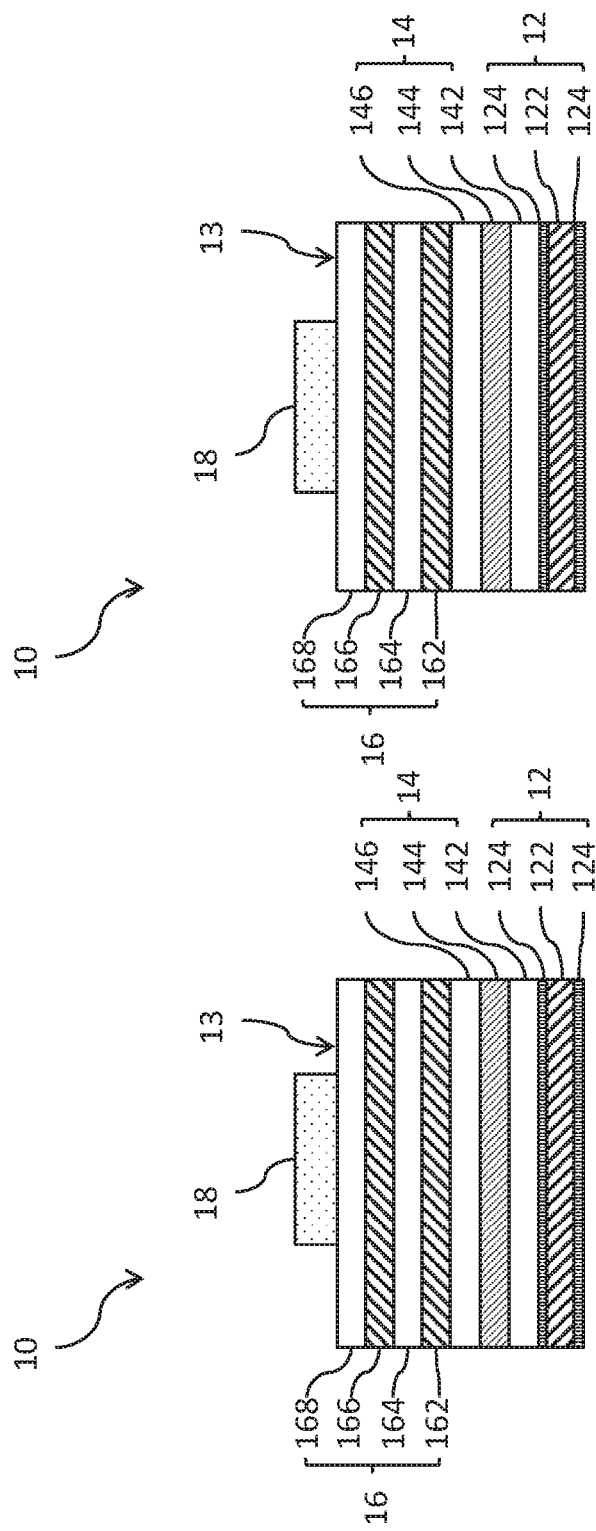

After describing the structure of the present invention, the method for fabricating the vertical type light-emitting diode die of the present invention is detailed as follows. Refer to FIG. 2 and FIGS. 3a-3f. Firstly, in Step S10 and FIG. 3a, a growth substrate 20 is provided, and an epitaxial layer 22 is formed on the growth substrate 20, and the epitaxial layer 22 is provided with a connecting metal layer 14 thereon. The connecting metal layer 14 includes a current distribution layer 146, a reflection layer 144, and a contact layer 142 from bottom to top. In the embodiment, the growth substrate 20 is a GaAs substrate. In Step S12 and FIG. 3b, a metallic combined substrate 12 is provided, wherein the metallic combined substrate 12 is formed by laser cutting, vacuum heating, and polishing, such that the metallic combined substrate 12 includes the first metal layer 122 and the two second metal layers 124 respectively formed on the top surface and the bottom surface of the first metal layer 122. In the embodiment, the polishing is chemical mechanical polishing (CMP) for the semiconductor fabrication process. Alternatively, a user chooses copper polishing. No matter CMP or copper polishing, the copper surface of the second metal layer 124 is polished to have surface roughness of 0.5~0.01 μm such that the copper surface is used as a connection surface. The laser cutting uses UV-laser radiation (266 nm). The vacuum heating is performed under 100~250 torr at 150~250° C. for 10~30 min. As a result, the stress of the metallic combined substrate 12 is eliminated and the metallic combined substrate 12 is formed into a flat metal plate having a thickness of less than 200 μm. In Step S14 and FIG. 3c, the metallic combined substrate 12 is connected to the epitaxial layer 22. The scope of the present invention should not be limited to the connection way that the metallic combined substrate 12 is connected to the epitaxial layer 22. In Step S16, the growth substrate 20 is removed by a chemical solution after the metallic combined substrate 12 is connected to the epitaxial layer 22. The structure without the growth substrate 20 is shown in FIG. 3d. In the embodiment, the chemical solution is a mixed solution of $NH_4OH$ and $H_2O_2$. In addition to the chemical solution, laser cutting is alternatively used, but the present invention is not limited thereto. In Step S18 and FIG. 3e, a plurality of electrode units 18 on the top surface of the epitaxial layer 22 by annealing. The alloy of Au and Ge is mixed with Au by annealing at a temperature of 360 degrees to form the electrode units 18, wherein the ratio of the alloy of Au and Ge to Au is 2:3 in amount. Since FIG. 3e is a cross-sectional diagram, the present invention only takes two electrode layers 18 as an example for explanation. The present invention does not limit the number of the electrode layers 18. The number of the electrode layers 18 is adaptable according to requirements. A plurality of electrode layers 18 may be used. In Step S20 and FIG. 3f, the epitaxial layer is divided according to the number of the plurality of electrode units 18, such that an epitaxial die 16 is formed on each connecting metal layer 14. The epitaxial die 16 includes the first AlGaInP layer 162, the multi-quantum wells (MQWs) layer 164, the second AlGaInP layer 166, and the GaAs layer 168. The bottom metallic combined substrate 12 includes the first metal layer 122 and the second metal layers 124. Since FIG. 3f is also a cross-sectional diagram, the present invention only takes two epitaxial dies 16 as an example for explanation, but the present invention is not limited thereto. The epitaxial layer 22 may be divided into the epitaxial dies 16 according to the number of the electrode units 18. The two epitaxial dies 16 and the two electrode units thereon are form one group. The epitaxial layer 22 may be divided into the epitaxial dies 16 by chemical etching or laser cutting, but the present invention is not limited thereto.

In the vertical type light emitting diode die fabricated by the abovementioned method, the metallic combined substrate is different from a conventional silicon substrate. The production yield of wire bonding of the metallic combined substrate is higher than that of a silicon substrate. The fabrication cost of the metallic combined substrate is lower than that of a general metal substrate made of Mo, and an alloy of Cu and W, or an alloy thereof. The metallic combined substrate of the present invention includes two metal layers and a mixed metal layer stacked. Thus, the metallic combined substrate is different from a general metal substrate. The metallic combined substrate of the present invention has a coefficient of thermal expansion of 5~7 ppm/K, preferably 6.1 ppm/K@20° C. The metallic combined substrate of the present invention has a high coefficient of thermal conductivity. The metallic combined substrate has a coefficient of thermal conductivity of 20~40 W/mK in a vertical direction and a coefficient of thermal conductivity of 170~280 W/mK in a horizontal direction. The metallic combined substrate is connected to the epitaxial layer through the connecting layer, such that the metallic combined substrate is quite a match for the epitaxial layer. The metallic combined substrate is thin enough. Without requiring a thinning process, the metallic combined substrate not only possesses a low coefficient of thermal expansion, a high coefficient of thermal conductivity, a low cost, and a high yield but also easily connects to the epitaxial layer. In addition, the metallic combined substrate has the soft magnetic property of initial magnetic permeability, wherein the initial magnetic permeability is larger than 2000. Thus, the metallic combined substrate uses the initial magnetic permeability to generate a micro current and transmit the micro current to the epitaxial electrode layer. After assembling the vertical type light emitting diode into a LED module, the LED module generates electricity and light without connecting to a voltage source, so as to satisfy the requirement for high power LEDs. On top of that, the metallic combined substrate is used as a permeance structure due to its soft property and effectively applied to a production process. Since each light emitting diode die has a very small volume, the light emitting diode is difficultly manually held. Even the light emitting diode is held by a machine, the machine must be very precise. It is very difficult to transport a great number of the light emitting diode dies. However, a magnetic component, such as a tiny needle head, will be installed on a robot arm in the future. Thus, the robot arm can absorb a great number of the vertical type light emitting diode dies with soft properties. In a fabrication process, the magnetic force is used to achieve the purpose of mass transfer, thereby improving the competitiveness for productions and overcoming the problem with mass transfer of micro LEDs.

Moreover, after dividing the epitaxial layer into the plurality of epitaxial dies, the connecting metal layer and the metallic combined substrate are divided according to the number of the plurality of epitaxial dies. One epitaxial die and one electrode unit form one group. Wire bonding and packaging processes are performed on the plurality of epitaxial dies, the connecting metal layer, and the metallic combined substrate to form vertical type light-emitting diodes. The present invention does not limit the subsequent fabrication process and the structures thereof, and the number of the structures. The abovementioned embodiment shows one group after a cutting process, but the present is not limited thereto. A plurality of groups is alternatively formed. The vertical type light emitting diode dies includes a plurality of groups each having two epitaxial dies and two electrode units. The number of the groups is adaptable according to the requirement of a user. In any environment, the quality of the vertical type light emitting diode die of the present invention is better than that of a conventional vertical light emitting diode die due to the metallic combined substrate of the present invention having a low coefficient of thermal expansion. The metallic combined substrate does not deform owning to the variation of temperature. The present invention can stably maintain the high lighting efficiency of the light emitting diodes.

Figure 4:
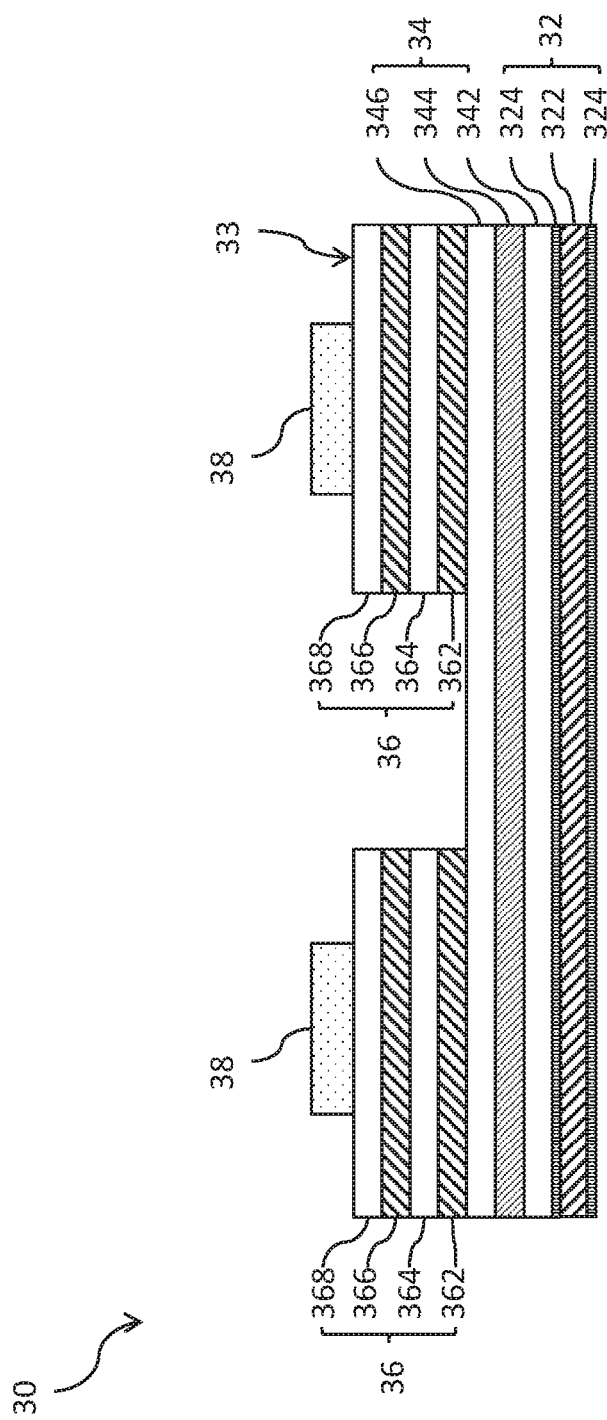
FIG. 4 is a diagram showing a vertical type light emitting diode die according to the second embodiment of the present invention.

The present invention does not limit the structure of the epitaxial electrode layer. Depending on how to cut the light emitting diode die, the number of the epitaxial dies on the connecting metal layer is one, two or more. As a result, the present invention provides a dual epitaxial structure, as shown in FIG. 4. The vertical type light emitting diode die 30 comprises a metallic combined substrate 32 and an epitaxial electrode layer 33. The epitaxial electrode layer 33 includes a connecting metal layer 34, two epitaxial dies 36, and two electrode units 38. The connecting metal layer 34 is formed on the metallic combined substrate 32, and the two epitaxial dies 36 are formed on the connecting metal layer 34, and the two electrode units 38 are respectively formed on the two epitaxial dies 36. The metallic combined substrate 32 includes a first metal layer 322 and two second metal layers 324. The two second metal layers 324 are respectively formed on the top surface and the bottom surface of the first metal layer 322. The connecting metal layer 34 includes a contact layer 342, a reflection layer 344, and a current distribution layer 346 from bottom to top. The contact layer 342 is formed on the metallic combined substrate 32. The reflection layer 344 is provided with two epitaxial dies 36 thereon. Each epitaxial die 36 includes a first AlGaInP layer 362, a multi-quantum wells (MQWs) layer 364, a second AlGaInP layer 366, and a GaAs layer 368. The first AlGaInP layer 362 is formed on the current distribution layer 346. The GaAs layer 368 is provided with the electrode unit 38 thereon. The structural content and the fabrication method of this embodiment is the same to those of the abovementioned embodiment. This embodiment is different from the abovementioned embodiment in that the vertical type light emitting diode die 30 of this embodiment which shown in FIG. 4 is divided with a group of two epitaxial dies 36, wherein the vertical type light emitting diode die 30 is cut from to bottom until the connecting metal layer 34.

The embodiments described above are only to exemplify the present invention but not to limit the scope of the present invention. Therefore, any equivalent modification or variation according to the shapes, structures, features, or spirit disclosed by the present invention is to be also included within the scope of the present invention.

What is claimed is:

1. A method for fabricating a vertical type light-emitting diode die comprising:

providing a growth substrate and forming an epitaxial layer on the growth substrate;

providing a metallic combined substrate formed by cutting, vacuum heating, and polishing, the vacuum heating is performed on the metallic combined substrate under 100~250 torr at 150~250° C. for 10~30 min, the metallic combined substrate further comprises a first metal layer and two second metal layers respectively formed on a top surface and a bottom surface of the first metal layer, the first metal layer comprises an alloy of nickel and ferrum, and the second metal layer comprises copper, a ratio of the second metal layer to the first metal layer to the second metal layer of the metallic combined substrate in thickness is 1:2.5~3.5:1, and a ratio of the nickel to the alloy is 36%;

forming a connecting metal layer on the metallic combined substrate and connecting the metallic combined substrate to the epitaxial layer through the connecting metal layer, and one of the two second metal layer is located between the epitaxial layer and the first metal layer;

removing the growth substrate;

forming a plurality of electrode units on a top surface of the epitaxial layer; and dividing the epitaxial layer into a plurality of epitaxial dies on the metallic combined substrate according to number of the plurality of electrode units.

2. The method for fabricating the vertical type light-emitting diode die according to claim 1, wherein after the step of dividing the epitaxial layer into the plurality of epitaxial dies, the connecting metal layer and the metallic combined substrate are divided according to number of the plurality of epitaxial dies, and wire bonding and packaging processes are performed on the plurality of epitaxial dies, the connecting metal layer and the metallic combined substrate to form light-emitting diodes.

3. The method for fabricating the vertical type light-emitting diode die according to claim 2, wherein the light-emitting diode generates electricity and light without connecting to a voltage source.

4. The method for fabricating the vertical type light-emitting diode die according to claim 1, wherein the metallic combined substrate has a high coefficient of thermal conductivity, a low coefficient of thermal expansion, and initial magnetic permeability.

5. The method for fabricating the vertical type light-emitting diode die according to claim 1, wherein a thickness of the metallic combined substrate is less than or equal to 200 μm.

6. The method for fabricating the vertical type light-emitting diode die according to claim 1, wherein the growth substrate is removed using a chemical solution or a laser.

* * * * *